United States Patent [19]
Shin

[11] Patent Number: 5,828,433
[45] Date of Patent: Oct. 27, 1998

[54] LIQUID CRYSTAL DISPLAY DEVICE AND A METHOD OF MANUFACTURING THE SAME

[75] Inventor: Woo Sup Shin, Kumi-si, Rep. of Korea

[73] Assignee: LG Electronics Inc., Seoul, Rep. of Korea

[21] Appl. No.: 944,967

[22] Filed: Oct. 7, 1997

Related U.S. Application Data

[63] Continuation of Ser. No. 616,291, Mar. 15, 1996, abandoned.

[30] Foreign Application Priority Data

Aug. 19, 1995 [KR] Rep. of Korea ................ 1995/25538

[51] Int. Cl.[6] ................. G02F 1/1343; G02F 1/1345
[52] U.S. Cl. ................. 349/147; 349/148; 349/152
[58] Field of Search ................ 349/43, 46, 139, 349/149, 152, 147, 148; 287/59, 72

[56] References Cited

U.S. PATENT DOCUMENTS

| | | | |
|---|---|---|---|
| 3,902,790 | 9/1975 | Hsieh et al. . | |
| 5,162,901 | 11/1992 | Shimada et al. | 349/147 |
| 5,187,604 | 2/1993 | Taniguchi et al. | 349/152 |
| 5,229,644 | 7/1993 | Wakai et al. | 257/749 |
| 5,233,448 | 8/1993 | Wu . | |
| 5,327,001 | 7/1994 | Wakai et al. | 257/350 |
| 5,383,041 | 1/1995 | Yamazaki et al. | 349/43 |
| 5,397,719 | 3/1995 | Kim et al. . | |
| 5,486,082 | 1/1996 | Takizawa et al. | 257/59 |
| 5,530,568 | 6/1996 | Yamamoto et al. | 349/139 |
| 5,532,850 | 7/1996 | Someya et al. | 349/46 |
| 5,539,549 | 7/1996 | Kishida et al. | 349/139 |
| 5,541,748 | 7/1996 | Ono et al. | 349/139 |
| 5,546,207 | 8/1996 | Kim | 349/139 |

FOREIGN PATENT DOCUMENTS

| | | |
|---|---|---|
| 0 090 988 A1 | 10/1983 | European Pat. Off. . |
| 0 312 389 A2 | 4/1989 | European Pat. Off. . |
| 0 449 123 | 10/1991 | European Pat. Off. . |
| 0 484 965 | 5/1992 | European Pat. Off. . |
| 0 530 834 | 3/1993 | European Pat. Off. . |
| 0 571 108 | 11/1993 | European Pat. Off. . |
| 0 587 144 A2 | 3/1994 | European Pat. Off. . |
| 0 622 659 | 11/1994 | European Pat. Off. . |
| 6-214245 | 8/1994 | Japan ............... 349/148 |
| 2 253 938 | 9/1992 | United Kingdom . |

*Primary Examiner*—William L. Sikes
*Assistant Examiner*—Tiep H. Nguyen
*Attorney, Agent, or Firm*—Finnegan, Henderson, Farabow, Garrett & Dunner, L.L.P.

[57] ABSTRACT

A method for fabricating a liquid crystal display is disclosed whereby a source and gate are exposed after the step of forming a passivation layer. As a result, the number of processing steps is reduced and yield is improved.

8 Claims, 5 Drawing Sheets

LIQUID CRYSTAL DISPLAY DEVICE AND A METHOD OF MANUFACTURING THE SAME

This application is a continuation, of application Ser. No. 08/616,291, filed Mar. 15, 1996, now abandoned.

BACKGROUND OF THE INVENTION

The present invention relates to a liquid crystal display (LCD) device and a method of manufacturing the same, and more particularly, to a liquid crystal display device having a combined source electrode and source pad structure.

Active matrix thin film displays include thin film transistors (TFTs) for driving the liquid crystal material in individual pixels of the display. As shown in FIG. 6, a conventional LCD includes an array of pixels each having liquid crystal material (not shown) sandwiched between a common electrode provided on a top plate (not shown) and a pixel electrode 6 disposed on a bottom plate. The bottom plate further includes a plurality of gate lines 600 intersecting a plurality of data lines 610.

Thin film transistors 620, serving as active devices, are located at intersecting portions of gate lines 600 and data lines 610. Gate lines 600 and data lines 610 are connected to the gates and sources, respectively of thin film transistors 620. In addition, pixel electrodes 6 are connected to respective drain electrodes of thin film transistors 620. Gate Pads 630 and Data Pads 640 are connected to the gate lines and data lines to receive datas from gate driver and data driver respectively.

A conventional method of manufacturing a liquid crystal display device including TFT driving elements will be described with reference to FIGS. 1a–1f.

As shown in FIG. 1a, a conductive layer is formed on a transparent glass substrate 1 and patterned to form gate 2, storage capacitor electrode 2D, source pad 2A, and gate pad 2B. Gate pad 2B is used for receiving a voltage to drive an active layer in the completed TFT device.

As shown in FIG. 1b, a gate insulating film 3, such as a nitride film or an oxide film, is formed on the entire surface of the substrate in order to electrically insulate gate 2. An amorphous silicon active layer 4 is formed on a portion of gate insulating film 3 overlying gate 2. Then, in order to reduce the contact resistance between the active layer and the source/drain regions in the completed device, and appropriately doped semiconductor layer 5 is formed on amorphous silicon layer 4 as an ohmic contact layer. Doped semiconductor layer 5 and amorphous silicon layer 4 are then etched in accordance with a predetermined active layer pattern.

Since a pad wiring layer is necessary in order to communicate information from an external driving circuit to the gate and source, a gate insulating film 3 is selectively etched to expose source pad 2A and gate pad 2B (see FIG. 1c). Next, as shown in FIG. 1d, a transparent conductive layer (ITO) is deposited on the entire surface of the substrate and patterned to form a pixel electrode 6, which is formed on a portion of the display pixel, while ITO patterns 6A and 6B are formed on source pad 2A and gate pad 2B, respectively.

As shown in FIG. 1e, the TFT is formed on the active layer and includes a conductive layer deposited on the substrate and simultaneously patterned to form source and drain electrodes 7 and 8, respectively. Source electrode 7 is connected to source pad 2A, and drain electrode 8 is contact with impurity-doped semiconductor layer 5 and pixel electrode 6. In the completed device structure, source electrode 7 conducts a data signal, received from a data wiring layer and drain electrode 8, to pixel electrode 6. The signal is stored in the form of charge on pixel electrode 6, thereby driving the liquid crystal.

As shown in FIG. 1f, a nitride film is deposited on the entire surface of the substrate as a passivation layer 9 in order to seal the underlying device from moisture and to prevent absorption of impurities. Passivation layer 9 is selectively etched to expose source pad 2A and gate pad 2B, thereby completing the TFT.

In the conventional method described above, The source electrode 7 and pixel electrode 6 provided on the same surface of gate insulating film 3. Accordingly, processing errors can cause these electrodes to contact each other. As a result, shorts can occur, thereby reducing yields.

Further, since the source pad for the source wiring is composed of the same material as the gate, its contact resistance with the underlying source electrode can be high. In addition, at least six masking steps are required as follows: patterning the gate, storage capacitor electrode, source pad and gate pad; forming the active layer pattern; patterning the gate insulating film for exposing the pad part; forming the pixel electrode; forming the source and drain electrode; and patterning the passivation film for exposing the pad part. Thus, the conventional process requires an excessive number of fabrication steps which increase cost and further reduce yield.

SUMMARY OF THE INVENTION

In order to solve the aforementioned problems, it is an objective of the present invention to provide a liquid crystal display device and a method of manufacturing the same, in which processing errors can be prevented and the Yield can be increased by etching the gate insulating film after the step of forming the passivation layer.

To accomplish this objective of the present invention, there is provided a liquid crystal display device comprising a substrate; a gate electrode; a gate pad and a source pad formed on the substrate as a first conductive layer; a gate insulating film formed on the entire surface of the substrate; a semiconductor layer and an impurity-doped semiconductor layer formed on the gate insulating film above the gate electrode; a source electrode and a drain electrode formed on the semiconductor layer; a passivation layer formed on the entire surface of the substrate; a first contact hole exposing the source pad; a second contact hole exposing a portion of the drain electrode; a third contact hole exposing the gate pad portion; and a fourth contact hole exposing the source electrode, the contact holes being formed by etching the passivation layer and gate insulating film; a pixel electrode connected with the drain electrode through the second contact hole; and a transparent conductive layer connecting the source pad with the source electrode through the first contact hole and fourth contact hole.

To further accomplish the objective of the present invention, there is also provided a method of manufacturing a liquid crystal display device, comprising the steps of forming a first conductive layer on a substrate; patterning the first conductive layer to respectively form a gate electrode, a gate pad and a source pad; sequentially forming an insulating film, a semiconductor layer and an impurity-doped semiconductor layer on the entire surface of the substrate; patterning the impurity-doped semiconductor layer and semiconductor layer to an active pattern; forming a second conductive layer on the entire surface of the substrate; patterning the second conductive layer to form a source electrode and a drain electrode; forming a passivation film on the entire surface of the substrate; Selectively etching the passivation film and insulting film to respectively form a first contact hole exposing the source pad, a second contact hole exposing a portion of the drain electrode, a third contact hole exposing a gate pad portion, and a fourth contact hole exposing a portion of the source electrode; forming a transparent conductive layer on the entire surface of the substrate; and patterning a pixel electrode connected with the drain electrode through the second contact hole, a transparent conductive layer connected with the gate pad through the third contact hole, and a transparent conductive layer connecting the source pad with the source electrode through the first and fourth contact holes.

BRIEF DESCRIPTION OF THE ATTACHED DRAWINGS

DETAILED DESCRIPTION OF THE INVENTION

Hereinafter, preferred embodiments of the present invention will be described with reference to the attached drawings.

Figure 1A:
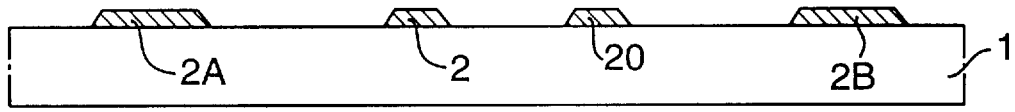
FIGS. 1a to 1f are cross-sectional views illustrating steps of a conventional method for manufacturing a liquid crystal display device.
Figure 1B:
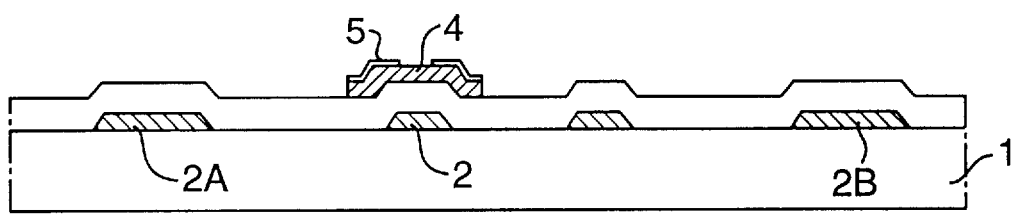
Figure 1C:
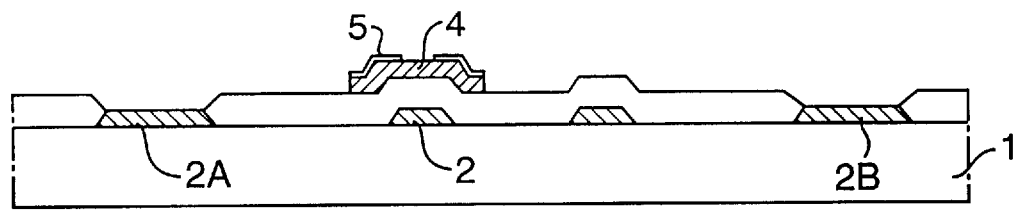
Figure 1D:
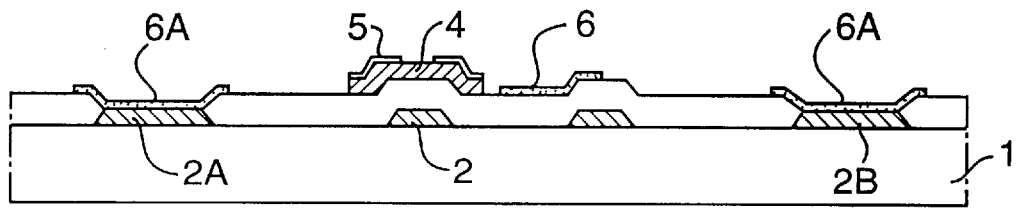
Figure 1E:
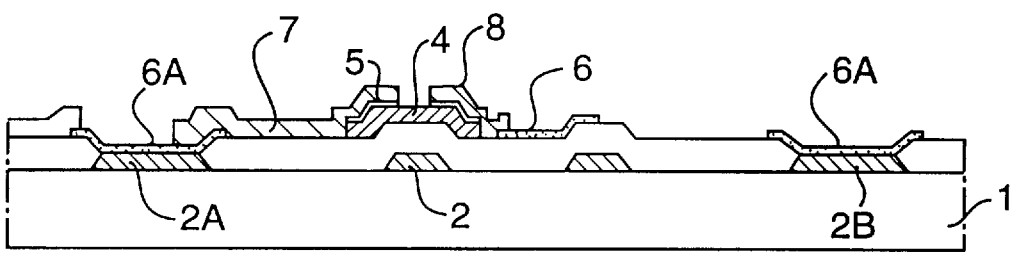
Figure 1F:
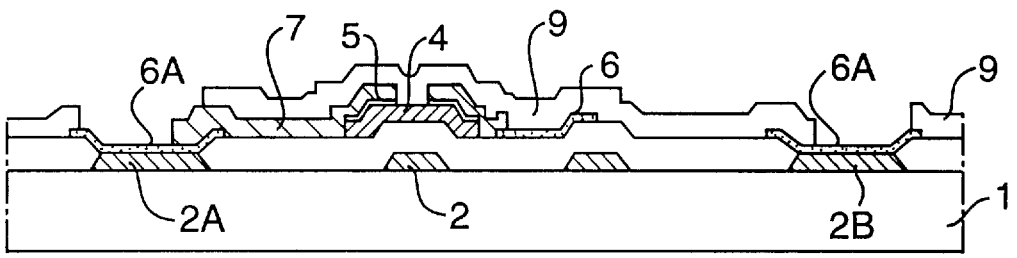
Figure 2A:
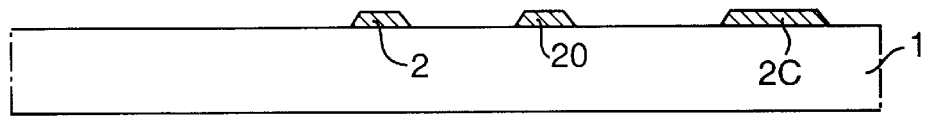
FIGS. 2a to 2e are cross-sectional views illustrating steps of a method for manufacturing a liquid crystal display according to a preferred embodiment of the present invention.

Referring first to FIG. 2a, a conductive layer is formed on a transparent glass substrate 1 and patterned to form a gate electrode 2, a storage capacitor electrode 2D, and a gate pad 2C, all of the same material. The gate electrode is used for applying a voltage in order to drive the active layer in the completed TFT device.

Figure 2B:
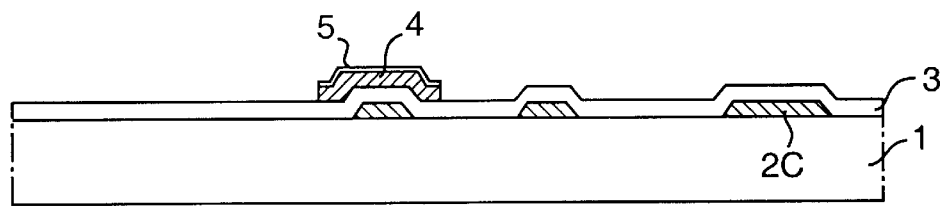

As shown in FIG. 2b, a gate insulating film 3 such as a nitride film or an oxide film is formed on the entire surface of the substrate in order to electrically insulate gate 2. Semiconductor active layer 4 is then formed on insulating gate 2. Active layer 4 is preferably made of amorphous silicon layer deposited by a chemical vapor deposition (CVD) process. Then, in order to reduce the contact resistance between the active layer and the subsequently formed source and drain, an impurity-doped semiconductor layer 5 is formed on amorphous silicon layer 4, as an ohmic contact layer. Impurity-doped semiconductor layer 5 and amorphous silicon layer 4 are etched according to a predetermined active layer pattern.

Figure 2C:
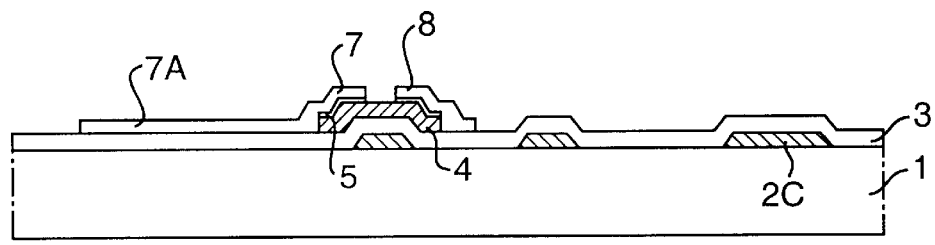

As shown in FIG. 2c, a conductive layer for forming source electrode 7 and drain electrode 8 is deposited on the substrate by patterning a sputtered layer of conductive material. Using the source and drain electrodes as masks, portions of the impurity-doped semiconductor layer 5 are exposed and then etched. Source electrode 7 thus forms part of a transistor region and serves as source pad 7A above the gate insulating film so that the same conductive layer constitutes part of the source wiring and the source electrode of the TFT.

Figure 2D:
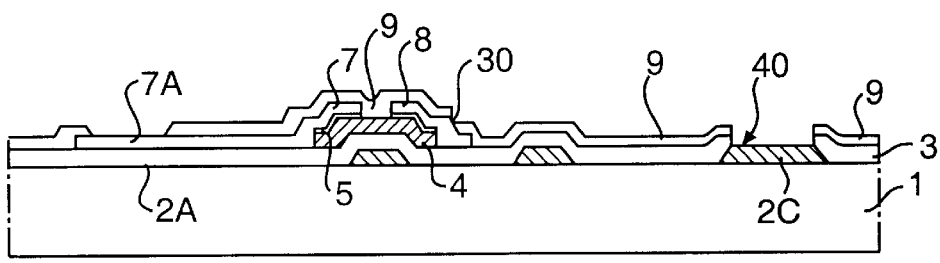

As shown in FIG. 2d, a passivation layer 9, e.g., a nitride film, is deposited on the entire surface of the substrate by a CVD process. Then, a predetermined portion of passivation layer 9 and gate insulating film 3 are selectively etched to form first, second and third contact holes 20, 30 and 40, thereby exposing a predetermined region of source pad 7A above gate insulating film 3, a predetermined region of drain electrode 8, and a predetermined region of gate pad 2C. For external electrical connections It is necessary to exposed pads 7A and 2C.

Figure 2E:
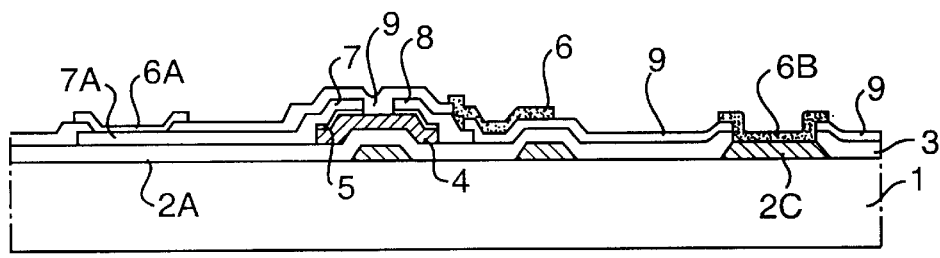

As shown in FIG. 2e, an indium tin oxide (ITO) layer is next deposited on the substrate by sputtering or a CVD process and etched according to a predetermined pattern to form a pixel electrode 6. As further shown in FIG. 2e, pixel electrode 6 is connected to the upper portion of drain electrode 8 At the same time, ITO pattern 6B is formed on gate pad 2C. In addition, ITO pattern 6A is provided on source pad 2A, which is part of a data electrode of the LCD. The TFT of the present invention having electrical contacts or wiring structures including gate pad 2C, layer 6B and layer 6A, source pad 7A is thus completed.

As described above, the pixel electrode 6 is formed after the passivation process in the present invention. In contrast, pixel electrode 6 is formed after the pad process or the source/drain formation process in the conventional method. Thus, the passivation layer is interposed between the source/drain formation material and the pixel electrode, thereby effectively isolating these layers and preventing shorts.

Further, unlike the conventional process, the method in accordance with the present invention does not require the step of exposing the pad directly after depositing the gate insulating film, and the source and gate pads are exposed by etching during the passivation process. Thus, the pixel electrode, which is made of ITO, is formed on the source and gate pads. In addition, the source pad is not formed of gate material, but is formed from the source formation material, while the source and drain are deposited. Thus, the problem of high contact resistance between the source pad and the source, caused by forming the source pad from the gate material, can be avoided.

Figure 3:
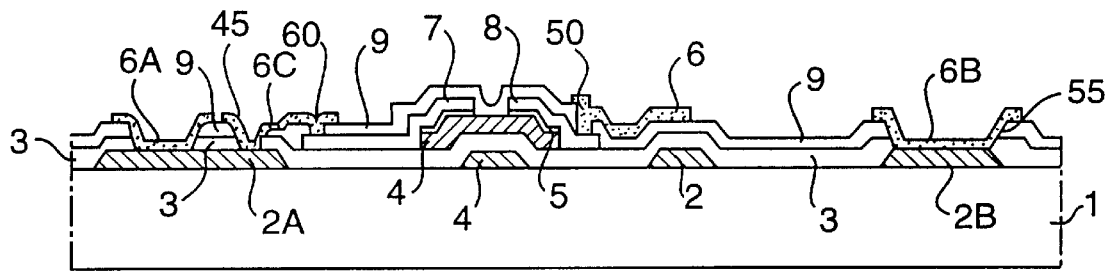
FIG. 3 is a cross-sectional view illustrating a liquid crystal display device structure according to a second embodiment of the present invention.

FIG. 3 illustrates a second embodiment of the present invention in which the step of etching the gate insulating layer and the step of etching the passivation layer to expose the pads are preformed in only one mask step. In particular, source pad 2A is composed of gate material, as in the conventional method, and is formed at the same time as gate 2, storage capacitor electrode 2D and gate pad 2B. After forming first, second, third and fourth contact holes 45, 50, 55 and 60, material for forming the pixel electrode is then deposited. As a result, since both the first (45) and fourth (60) contact holes are formed over source pad 2A (formed of the same material as the gate) and source electrode 7, respectively, the source electrode 7 and source pad 2A may be connected to each other in the same step that the pixel electrode is formed. Thus, after patterning, a first transparent conductive layer 6C connects source electrode 7 with source pad 2A, and a second transparent conductive layer 6 (i.e., the pixel electrode) is connected to drain electrode 8.

In other words, a conductive layer is formed on a transparent glass substrate 1 and patterned to form gate 2, a storage capacitor electrode 2D,. a source pad 2A and a gate pad 2B. After forming a gate insulating film 3 on the entire surface of the substrate, an amorphous silicon layer 4 and an impurity-doped semiconductor layer 5 are sequentially formed therson. These layers are then etched in accordance with a predetermined active layer pattern.

Then, a conductive layer is formed on the substrate and etched in accordance with a predetermined pattern, thereby forming a source electrode 7 and a drain electrode 8. After forming a passivation layer 9 on the entire surface of the substrate, passivation layer 9 and gate insulating film 3 are selectively etched, thereby forming a first contact hole exposing the source pad 2A and a third contact hole exposing the gate pad 2B. Since the passivation layer 9 and gate insulating film 3 are preferably etched in a single step, the sidewalls of the first and second contact holes are planar and smooth.

ITO is then deposited on the entire surface of the substrate and patterned to form a pixel electrode 6 connected to drain electrode 8 through the contact hole overlying drain electrode 8 in the pixel part. At the same time, ITO patterns 6A, 6B and 6C are formed to contact source pad 2A and gate pad 2B through the contact holes formed at gate insulating film 3 and passivation layer 9.

Figure 4:
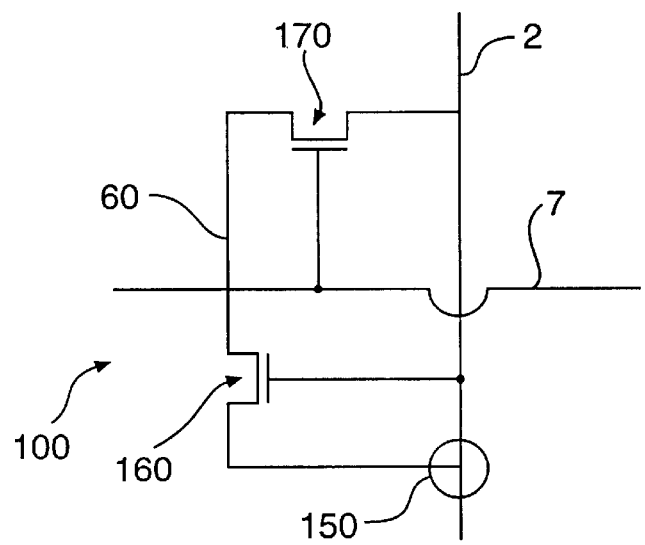
FIG. 4 is a circuit diagram of one example of a liquid crystal display device in which a gate material is connected with a source material in accordance with a third embodiment of the present invention.
Figure 5:
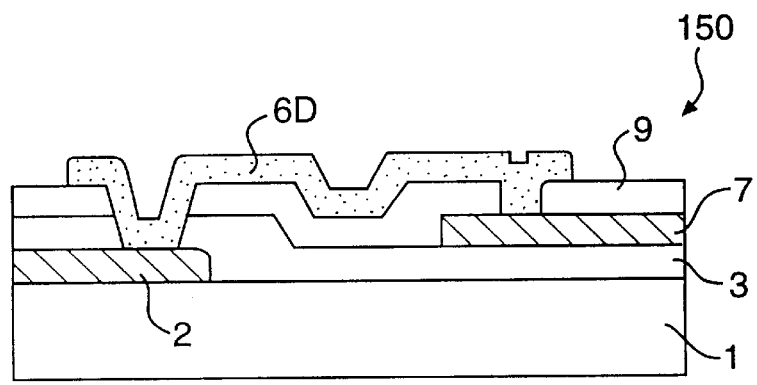
FIG. 5 is a vertical-cross-sectional view of the device shown in FIG. 4.
Figure 6:
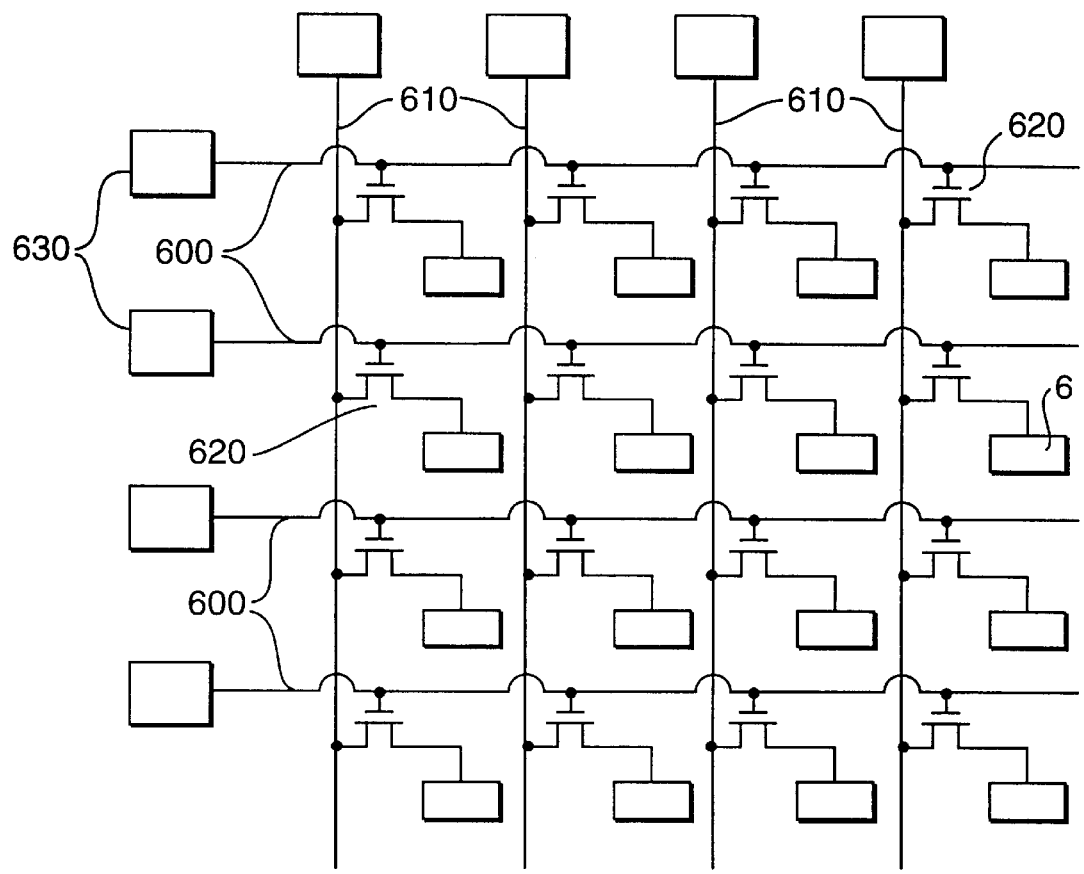
FIG. 6 is a plan view schematic representation of one prior embodiment of a matrix display.

Further, in accordance with an additional embodiment of the present invention, a repair line or static electricity protection circuit can also be provided during deposition of the pixel electrode layer. FIG. 4 is a schematic diagram of static electricity protection circuit 100, and FIG. 5 is an enlarged cross-sectional view of a portion 150 of the circuit.

In the circuit shown in FIG. 4. if a high potential due to an electrostatic discharge is present on source electrode 7, for example, transistor 170 is rendered conductive to discharge source electrode 7 to gate line 2. Similarly, gate line 2 can discharge to source electrode 7 via transistor 160. As shown in FIG. 5, the connection between gate line 2 and source electrode 7 is achieved by forming contact holes in insulative films 3 and 9 and then depositing conductive material (preferabel ITO) into these holes while forming the pixel electrode.

According to the present invention as described above, the manufacture of the TFT of the liquid crystal display device can be accomplished using five mask steps (step of forming the gate, step of forming the active layer, step of forming the source and drain, step of etching the passivation layer and gate insulating film, and step of forming the pixel electrode), while the conventional process requires six or mor mask steps. Thus, manufacturing cost can be reduced.

Further, when the source pad is formed from the same material as the source electrode, the contact resistance problem caused when the source pad is in contact with the source electrode can be solved. In addition, since the pixel electrode is formed after forming the passivation layer, processing errors resulting in the pixel electrode contacting the source and drain can be prevented.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A pad for providing an electrical connection to a switching device, said pad comprising:
   a substrate;
   an insulating layer over said substrate;
   a semiconductor active layer over said insulating layer;
   a data electrode having a first portion on and contiguous to said insulating layer and a second portion over said semiconductor active layer;
   a passivation layer on said second portion of said data electrode; and
   an indium tin oxide layer on said first portion of said data electrode for connecting the pad to wiring external to the switching device.

2. A liquid crystal display device comprising:
   a substrate;
   an insulating layer over said substrate;
   a semiconductor active layer over said insulating layer;
   a switching element having a data electrode, a first portion of said data electrode on and contiguous to said insulating layer and a second portion of said data electrode over the semiconductor active layer;
   a passivation layer on said second portion of said data electrode; and
   a pad including a portion of said data electrode and an indium tin oxide layer provided on said first portion of said data electrode for connecting the pad to wiring external to the switching element.

3. A liquid crystal display device, comprising:
   a substrate;
   an insulating layer on the substrate;
   a data line on and contiguous to said insulating layer;
   a pad including a portion of said data line;
   a conductive layer on said substrate;
   first and second insulative layers on said conductive layer, said first and second insulative layers including a common hole exposing a portion of said conductive layer, a sidewall of said hole being substantially smooth; and
   an indium tin oxide (ITO) layer on said exposed portion of said conductive layer and on said data line.

4. A liquid crystal display device comprising:
   a substrate;
   an insulating layer over said substrate;
   a semiconductor active layer over said insulating layer;
   a data line, a first portion of the data line on and contiguous to the insulating layer and a second portion of said data line on the semiconductor active layer;
   a passivation layer on said second portion of said data line; and
   a pad, said pad including:
      a portion of said insulating layer;
      said first portion of said data line, and
      an indium tin oxide (ITO) layer on said first portion of said data line for connecting the pad to wiring external to the data line and the pad.

5. A liquid crystal display device, comprising:
   a substrate;
   an insulating layer on the substrate;
   a data line on and contiguous to said insulating layer;
   a first pad including a portion of said data line; and
   a second pad comprising:
      a first insulative layer having a contact hole exposing a portion of said substrate;
      a second insulative layer having a second contact hole aligned with said first contact hole;
      a first conductive layer formed on said exposed surface of said substrate; and a second conductive layer of indium tin oxide (ITO) formed on said first conductive layer and on said data line.

6. A liquid crystal display device in accordance with claim 5, wherein said second conductive layer includes a portion of said layer of indium tin oxide.

7. A method of manufacturing a liquid crystal display device, comprising the steps of:

forming a first conductive layer on a substrate;

patterning said first conductive layer to form a gate electrode and a gate pad;

forming an insulating film on said substrate including said gate electrode and said gate pad;

forming a semiconductor layer on said insulating film;

forming an impurity-doped semiconductor layer on said semiconductor layer;

selectively removing a portion of said impurity doped semiconductor layer and said semiconductor layer, except for a portion overlying said gate electrode;

forming a second conductive layer on said subsrate;

pattering said second conductive layer to form a source electrode, a source pad, and a drain electrode, said source electrode connected to said source pad;

forming passivation film on the entire surface of said subsrate;

selectively etching said passivation film and said insulating film to form a first contact hole to expose said source pad, a second contact hole to expose a portion of said drain electrode, and a third contact hole to expose said gate pad;

forming a transparent conductive layer on said substrate; and patterning said transparent conductive layer to form a first transparent conductive layer pattern connected with said source pad via said first contact hole, a pixel electrode connected with said drain electrode through said second contact hole, and a second transparent conductive layer connected with said gate pad through said third contact hole.

8. A method of manufacturing a liquid crystal display device in accordance with claim 7, wherein said step of selectively etching said passivation film and said insulating film constitutes a single etch step.

* * * * *